(12) United States Patent
Trinh et al.

(10) Patent No.: US 11,732,356 B2
(45) Date of Patent: Aug. 22, 2023

(54) MULTILAYER ENCAPSULATION STACKS BY ATOMIC LAYER DEPOSITION

(71) Applicant: Applied Materials, Inc., Santa Clara, CA (US)

(72) Inventors: Cong Trinh, Santa Clara, CA (US); Mihaela A. Balseanu, Sunnyvale, CA (US); Maribel Maldonado-Garcia, San Jose, CA (US); Ning Li, San Jose, CA (US); Mark Saly, Santa Clara, CA (US); Bhaskar Jyoti Bhuyan, San Jose, CA (US); Keenan N. Woods, San Ramon, CA (US); Lisa J. Enman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 16/941,843

(22) Filed: Jul. 29, 2020

(65) Prior Publication Data
US 2021/0032749 A1 Feb. 4, 2021

Related U.S. Application Data

(60) Provisional application No. 62/879,680, filed on Jul. 29, 2019.

(51) Int. Cl.
*C23C 16/455* (2006.01)
*C23C 16/02* (2006.01)
*H01L 21/56* (2006.01)
*H10N 70/00* (2023.01)

(52) U.S. Cl.
CPC .... *C23C 16/45542* (2013.01); *C23C 16/0209* (2013.01); *C23C 16/45546* (2013.01); *C23C 16/45553* (2013.01); *H01L 21/56* (2013.01); *H10N 70/023* (2023.02)

(58) Field of Classification Search
CPC ................................................. C23C 16/345
See application file for complete search history.

(56) References Cited

U.S. PATENT DOCUMENTS

| 8,921,148 B2 | 12/2014 | Elowe et al. |
| 9,373,500 B2 | 6/2016 | Swaminathan et al. |
| 9,385,318 B1 | 7/2016 | Henri |
| 9,601,693 B1 | 3/2017 | Henri et al. |
| 9,824,881 B2 | 11/2017 | Niskanen et al. |

(Continued)

FOREIGN PATENT DOCUMENTS

| JP | 2011054968 A | 3/2011 |
| WO | 2019060069 A1 | 3/2019 |

OTHER PUBLICATIONS

PCT International Search Report and Written Opinion in PCT/US2020/043965 dated Nov. 3, 2020, 14 pages.

*Primary Examiner* — Joseph A Miller, Jr.
(74) *Attorney, Agent, or Firm* — Servilla Whitney LLC

(57) ABSTRACT

Methods of depositing an encapsulation stack without damaging underlying layers are discussed. The encapsulation stacks are highly conformal, have low etch rates, low atomic oxygen concentrations, good hermeticity and good adhesion. These films may be used to protect chalcogen materials in PCRAM devices. Some embodiments utilize a two-step process comprising a first ALD process to form a protective layer and a second plasma ALD process to form an encapsulation layer.

18 Claims, 10 Drawing Sheets

(56) References Cited

U.S. PATENT DOCUMENTS

| | | | |
|---|---|---|---|
| 10,128,437 B1 | 11/2018 | Fantini et al. | |
| 2001/0000866 A1* | 5/2001 | Sneh | H01L 21/28556 |
| | | | 118/723 R |
| 2004/0121085 A1* | 6/2004 | Wang | H01L 29/665 |
| | | | 427/255.394 |
| 2006/0216418 A1* | 9/2006 | Matsuura | C23C 16/45542 |
| | | | 427/248.1 |
| 2010/0124621 A1* | 5/2010 | Kobayashi | C23C 16/402 |
| | | | 427/579 |
| 2015/0287593 A1* | 10/2015 | Canaperi | H01L 21/02126 |
| | | | 257/773 |
| 2019/0057857 A1 | 2/2019 | Ishikawa et al. | |
| 2019/0330736 A1* | 10/2019 | Wang | C23C 16/4554 |

* cited by examiner

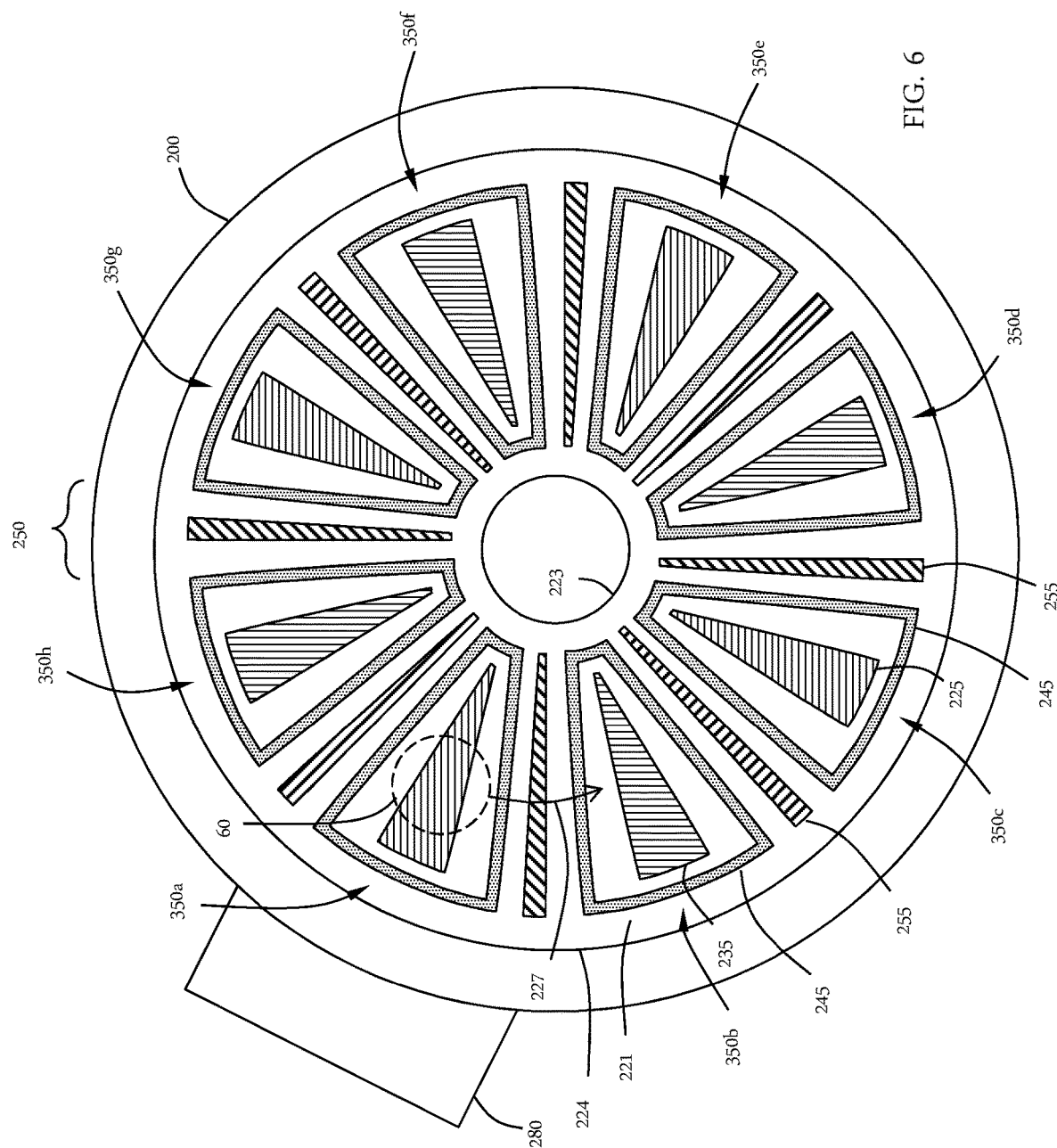

MULTILAYER ENCAPSULATION STACKS BY ATOMIC LAYER DEPOSITION

CROSS-REFERENCE TO RELATED APPLICATIONS

This application claims priority to U.S. Provisional Application No. 62/879,680, filed Jul. 29, 2019, the entire disclosure of which is hereby incorporated by reference herein.

FIELD

Embodiments of the disclosure generally relate to the fabrication of semiconductors, including processes for forming multilayer encapsulation stacks. More particularly, certain embodiments of the disclosure are directed to methods for depositing encapsulation stacks for PCRAM devices.

BACKGROUND

Phase change random-access memory (PCRAM) is a type of emerging non-volatile memory with an increasing number of applications and fast market growth. PCRAM relies on a phase change layer consisting of a chalcogenide material. The chalcogenide materials are sensitive to air and moisture. Silicon nitride (SiN) thin films can be used as encapsulation layers to protect the chalcogenide materials.

Many conventional methods used to deposit SiN films have drawbacks. Some methods, such as chemical vapor deposition (CVD), rely on higher temperatures that can damage devices. Some methods, such as plasma enhanced chemical vapor deposition (PECVD), are able to deposit at lower temperatures, but require subsequent plasma post treatment to improve film quality.

The PECVD processes are also limited by poor step coverage and the film quality may strongly depend on the post treatment efficiency. As device density continues to increase, these processes are not extendable to the next generation of device with larger aspect ratios.

The PCRAM stacks contain materials which are sensitive to other processing conditions as well. An ideal process for forming an encapsulation layer would be able to be performed at low temperatures without damaging the underlying materials, would demonstrate good adhesion to the underlying materials, would provide suitable protection against air, water and moisture, and would have a high density and low wet etch rate.

Therefore, there is a need in the art for methods of forming encapsulation layers on high aspect ratio features which limit damage to the underlying layers and satisfy manufacturing requirements.

SUMMARY

One or more embodiments of the disclosure are directed to a method of forming an encapsulation stack. The method comprises providing a substrate with at least one feature with a surface. A conformal dielectric protective layer is formed on the surface of the feature by sequentially exposing the substrate to a first reactant and a second reactant. A conformal hermetic encapsulation layer is formed on the protective layer by sequentially exposing the substrate to a silicon precursor and a nitrogen precursor and a second plasma. The encapsulation layer comprises silicon nitride. The substrate is maintained at a temperature less than or equal to about 400° C. and the surface of the feature is substantially undamaged by the method.

Additional embodiments of the disclosure are directed to a method of forming an encapsulation stack. The method comprises providing a substrate with at least one feature with a surface. The feature has an aspect ratio greater than or equal to about 5:1. A conformal dielectric protective layer is formed on the surface of the feature by sequentially exposing the substrate to a first reactant and a second reactant. The substrate is maintained at a pressure greater than or equal to about 5 Torr, and the protective layer is formed at a rate of greater than or equal to about 10 Å/min. A conformal hermetic encapsulation layer is formed on the protective layer by sequentially exposing the substrate to a silicon precursor and a nitrogen precursor and a second plasma. The encapsulation layer comprises silicon nitride. The second plasma has a power greater than or equal to about 50 W. The substrate is maintained at a pressure less than or equal to about 20 Torr. The substrate is maintained at a temperature less than or equal to about 400° C. and the surface of the feature is substantially undamaged by the method.

Further embodiments of the disclosure are directed to a method of forming an encapsulation stack. The method comprises providing a substrate with at least one feature with a surface. A conformal dielectric protective layer is formed on the surface of the feature by sequentially exposing the substrate to a first reactant and a second reactant. The protective layer comprises a dielectric comprising one or more of silicon nitride, amorphous silicon, aluminum nitride or aluminum oxide. A conformal hermetic encapsulation layer is formed on the protective layer by sequentially exposing the substrate to a silicon precursor and a nitrogen precursor and a second plasma. The encapsulation layer comprises silicon nitride and has a wet etch rate of less than or equal to about 8.5 Å/min in 100:1 DHF. The thickness of the encapsulation layer is about 10 Å. The substrate is maintained at a temperature less than or equal to about 400° C. and the surface of the feature is substantially undamaged by the method.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 shows a schematic view of a batch processing chamber in accordance with one or more embodiment of the disclosure;

Figure 1:
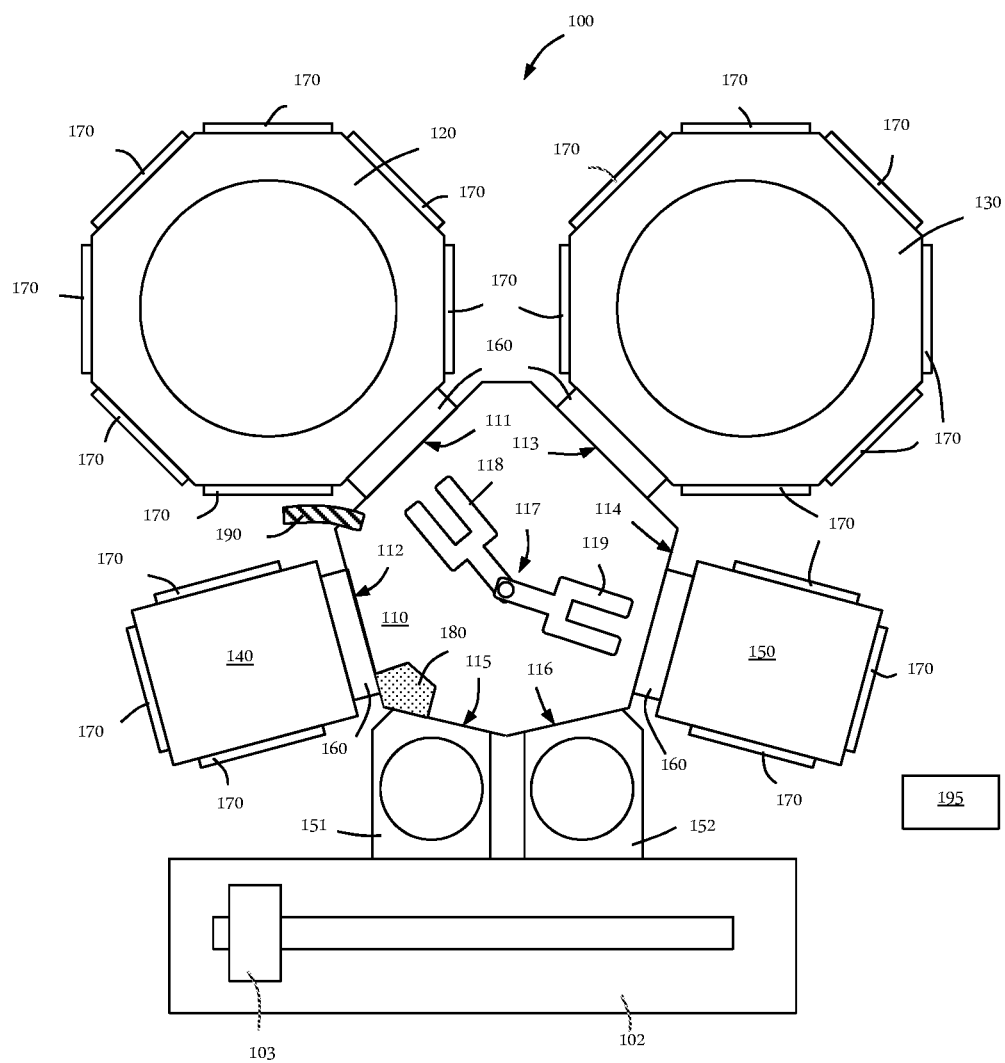
FIG. 1 shows a schematic view of a processing platform in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used in this specification and the appended claims, the terms "precursor", "reactant", "reactive gas" and the like are used interchangeably to refer to any gaseous species that can react with the substrate surface.

A "pulse" or "dose" as used herein is intended to refer to a quantity of a process gas that is intermittently or noncontinuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Some embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

Embodiments of this disclosure advantageously provide methods of depositing an encapsulation stack at lower temperatures and with minimal damage to the underlying substrate. As used in this regard, "lower temperatures" are evaluated relative to temperatures typically used in thermal CVD and ALD processes.

Some embodiments of this disclosure advantageously provide methods performed at lower temperatures without damage to the underlying substrate materials. Damage to the underlying substrate may be evidenced by a change in film properties (etch rate, density, etc.), a change in elemental composition (oxidation, nitridation, etc.) and/or a change in thickness (etching, expansion, shrinking, etc.).

Some embodiments advantageously provide good adhesion to the underlying substrate materials. Adhesion can be tested by a tape test. Approximately 50 nm of a test film is deposited on a substrate, the area is scribed into a test array (e.g., 10×10), and tape is applied to the scribed area and then removed. The removed tape as well as the substrate is inspected for traces of the deposited film. Dies which have no film removed have passed. Adhesion is typically presented as a percent of dies which pass. Some embodiments of this disclosure provide films with about 100% pass rates.

Some embodiments advantageously provide good hermeticity and effectively protect the underlying materials from air, water and moisture. Some embodiments advantageously provide encapsulation stacks with higher density and/or lower wet etch rates.

Some embodiments of the disclosure utilize a time-domain ALD process. Said processes can be performed on processing platforms commonly known in the art.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

Some embodiments of the disclosure utilize a spatial ALD process which is performed on a processing platform as disclosed herein. Referring to FIGS. 1-6, FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The central transfer station 110 shown has a first side 111, a second side 112, a third side 113, a fourth side 114, a fifth side 115 and a sixth side 116. Although six sides are shown, those skilled in the art will understand that there can be any suitable number of sides to the central transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A first batch processing chamber 120 can be connected to a first side 111 of the central transfer station 110. The first batch processing chamber 120 can be configured to process x wafers at a time for a batch time. In some embodiments, the first batch processing chamber 120 can be configured to process in the range of about four (x=4) to about 12 (x=12) wafers at the same time. In some embodiments, the first batch processing chamber 120 is configured to process six (x=6) wafers at the same time. As will be understood by the skilled artisan, while the first batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
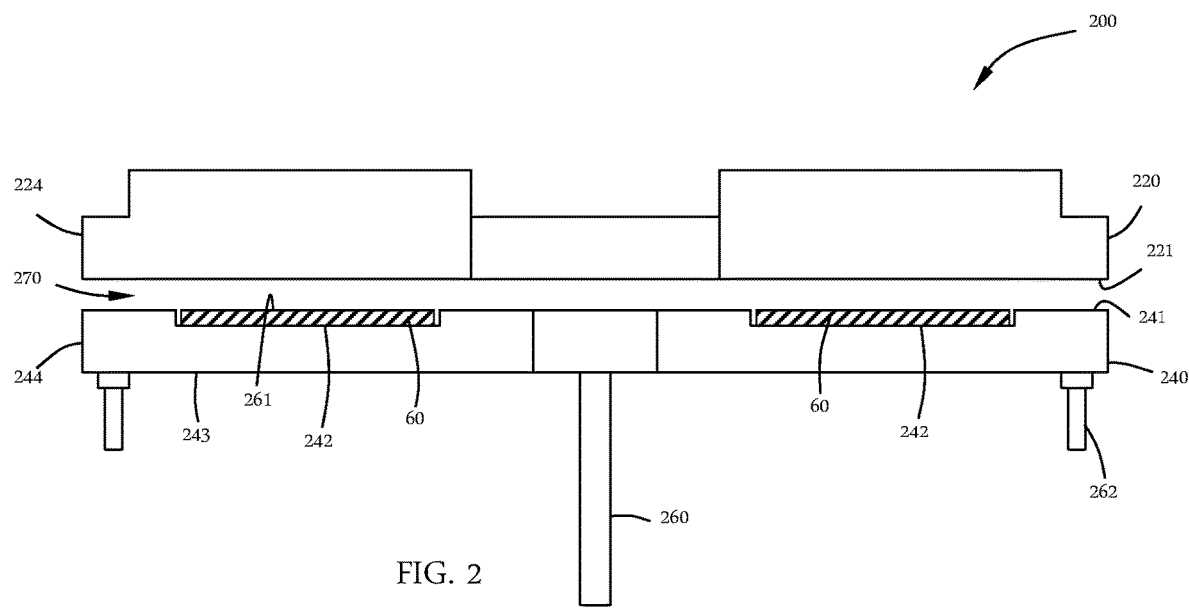
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
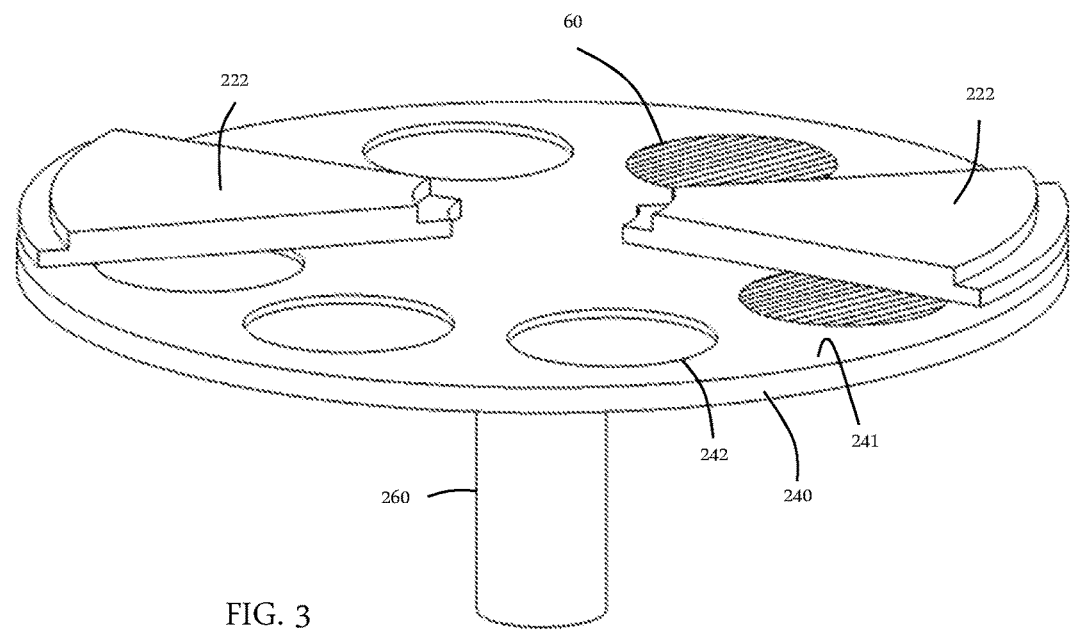
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
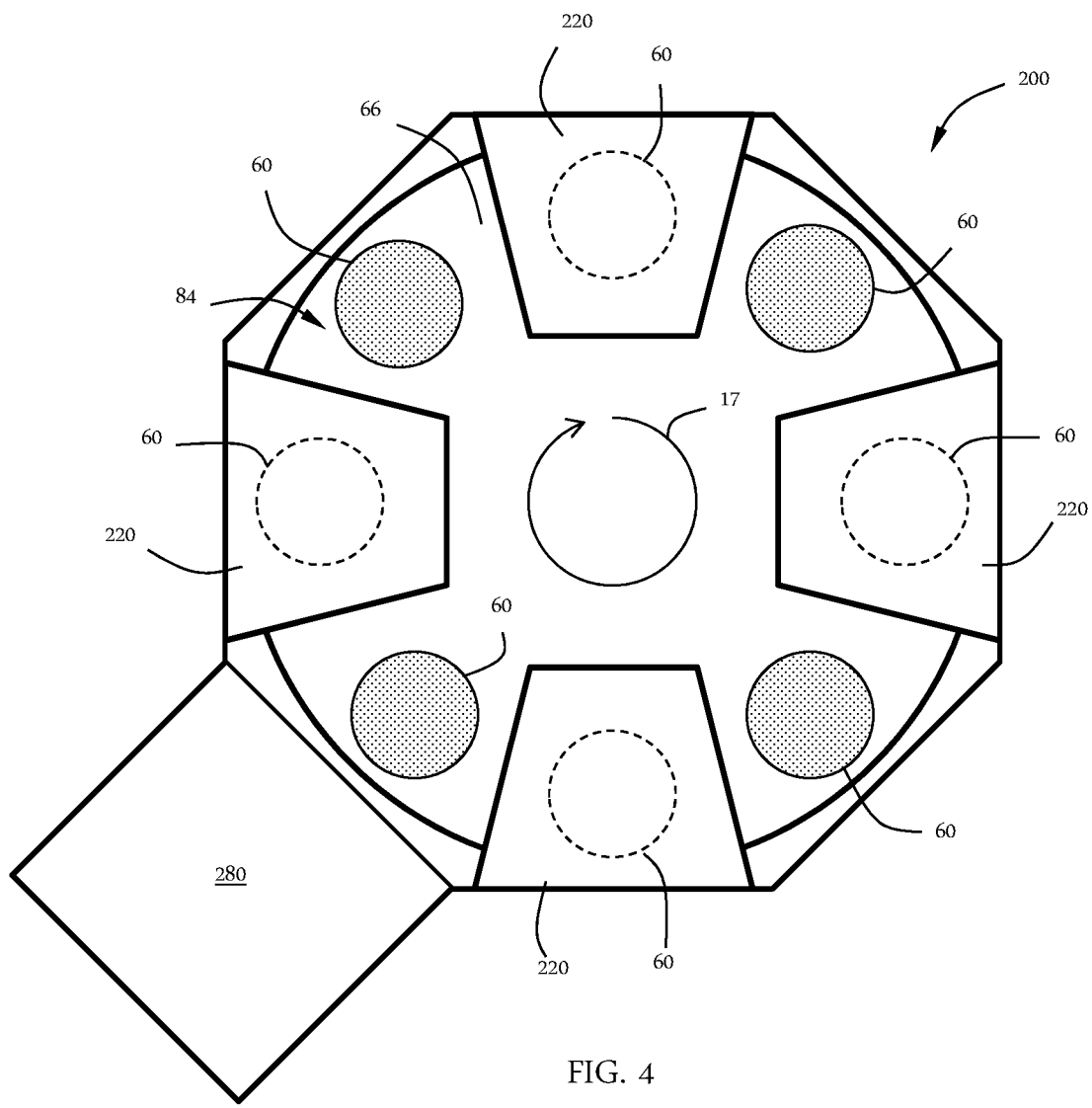
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example the substrates (also referred to as substrates 60) to be loaded/unloaded from the processing chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing routines between each layer deposition (e.g., exposure to plasma).

Figure 5:
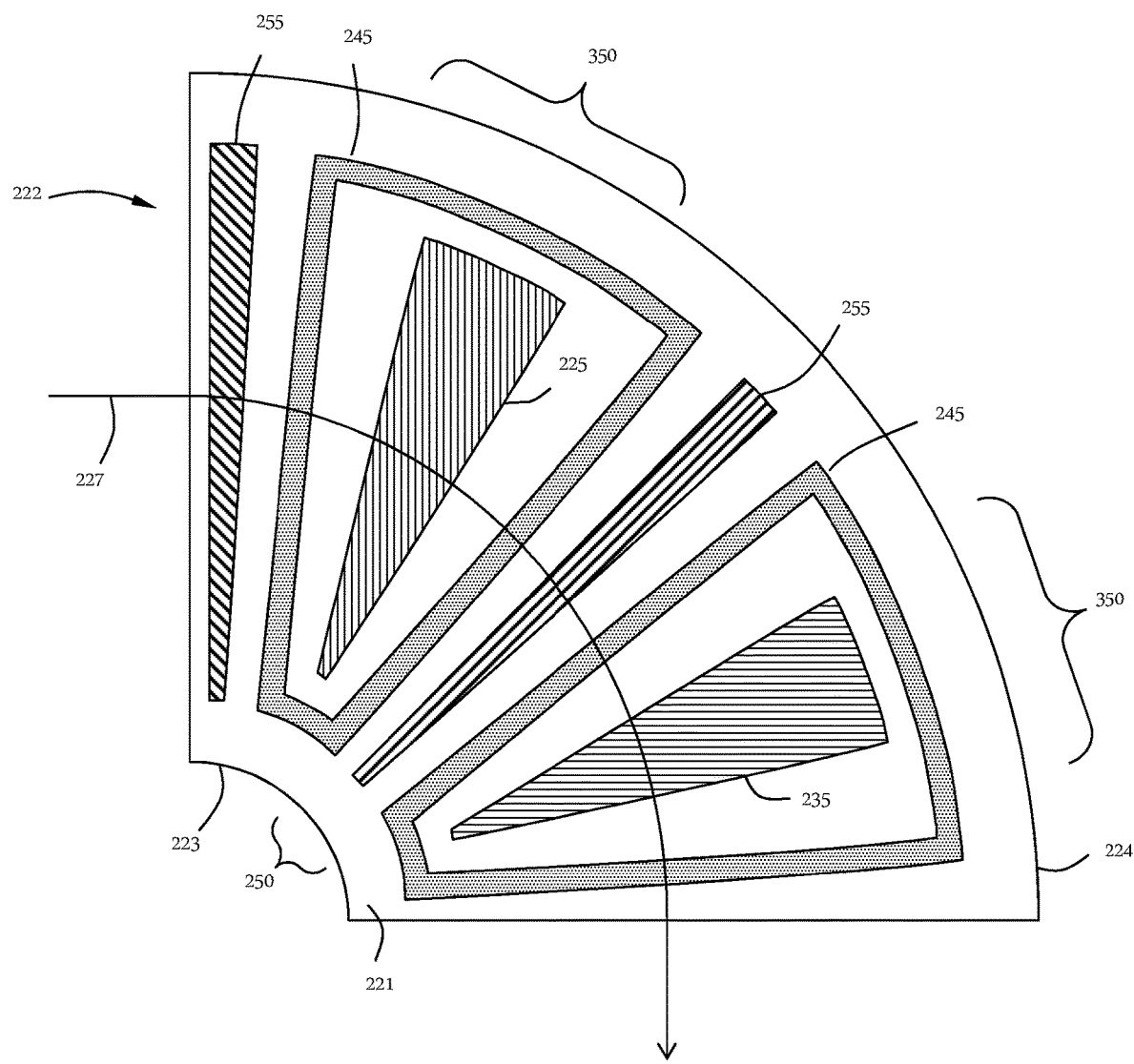
FIG. 5 shows a schematic view of a portion of a wedge shaped gas distribution assembly for use in a batch processing chamber in accordance with one or more embodiment of the disclosure.

FIG. 5 shows a sector or portion of a gas distribution assembly 220, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiment may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas and the second reactive gas to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface (as shown in FIG. 4), which can be, for example, a load lock chamber 280, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution assembly 220. The substrate 60 is loaded via the factory interface into the processing chamber 200 onto a substrate support or susceptor assembly (see FIG. 4).

The substrate 60 can be shown positioned within a process region because the substrate is located adjacent the first reactive gas port 225 and between two gas curtains 250a, 250b. Rotating the substrate 60 along path 227 will move the substrate 60 counter-clockwise around the processing chamber 200. Thus, the substrate 60 will be exposed to the first process region 350a through the eighth process region 350h, including all process regions between.

Some embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of some embodiments is configured to expose the wafers to a process to treat the wafers before and/or after processing in first batch processing chamber 120. The treatment chamber 140 of some embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In some embodiments, the processing platform further comprises a second batch processing chamber 130 connected to a third side 113 of the central transfer station 110. The second batch processing chamber 130 can be configured similarly to the first batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second treatment chamber 150 connected to a fourth side 114 of the central transfer station 110. The second treatment chamber 150 can be the same as the treatment chamber 140 or different.

The processing platform 100 can include a controller 195 connected to the robot 117 (the connection is not shown). The controller 195 can be configured to move wafers between the treatment chamber 140 and the first batch processing chamber 120 with a first arm 118 of the robot 117. In some embodiments, the controller 195 is also configured to move wafers between the second treatment chamber 150 and the second batch processing chamber 130 with a second arm 119 of the robot 117.

In some embodiments, the controller 195 is connected to the susceptor assembly 240 and the gas distribution assembly 220 of a processing chamber 200. The controller 195 can be configured to rotate 17 the susceptor assembly 240 about a central axis. The controller can also be configured to control the gas flows in the gas ports 225, 235, 245, 255. In some embodiments, the first reactive gas port 225 provides a flow of a ruthenium precursor. In some embodiments, the second reactive gas port 235 provides a flow of a reactant. In some embodiments, other gas ports (not labelled) may provide a flow of a plasma. The first reactive gas port 225, the second reactive gas port 235 and the other reactive gas ports (not labelled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the treatment chamber 140 and the first batch processing chamber 120 using the first arm 118 of the robot 117. In some embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the central transfer station 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the processing platform 100. A robot 103 within the factory interface 102 can be moved the wafers or cassettes into and out of the buffer stations 151, 152. The wafers or cassettes can be moved within the processing platform 100 by the robot 117 in the central transfer station 110. In some embodiments, the factory interface 102 is a transfer station of another cluster tool.

In some embodiments, the processing platform 100 or first batch processing chamber 120 is connected to a controller. The controller can be the same controller 195 or a different controller. The controller can be coupled to the susceptor assembly and the gas distribution assembly of the first batch processing chamber 120 and has one or more configurations. The configurations can include, but are not limited to, a first configuration to rotate the susceptor assembly about the central axis, a second configuration to provide a flow of a ruthenium precursor to a process region, a third configuration to provide a flow of a reactant to a process region, a fourth configuration to provide a plasma in a process region.

Figure 7A:
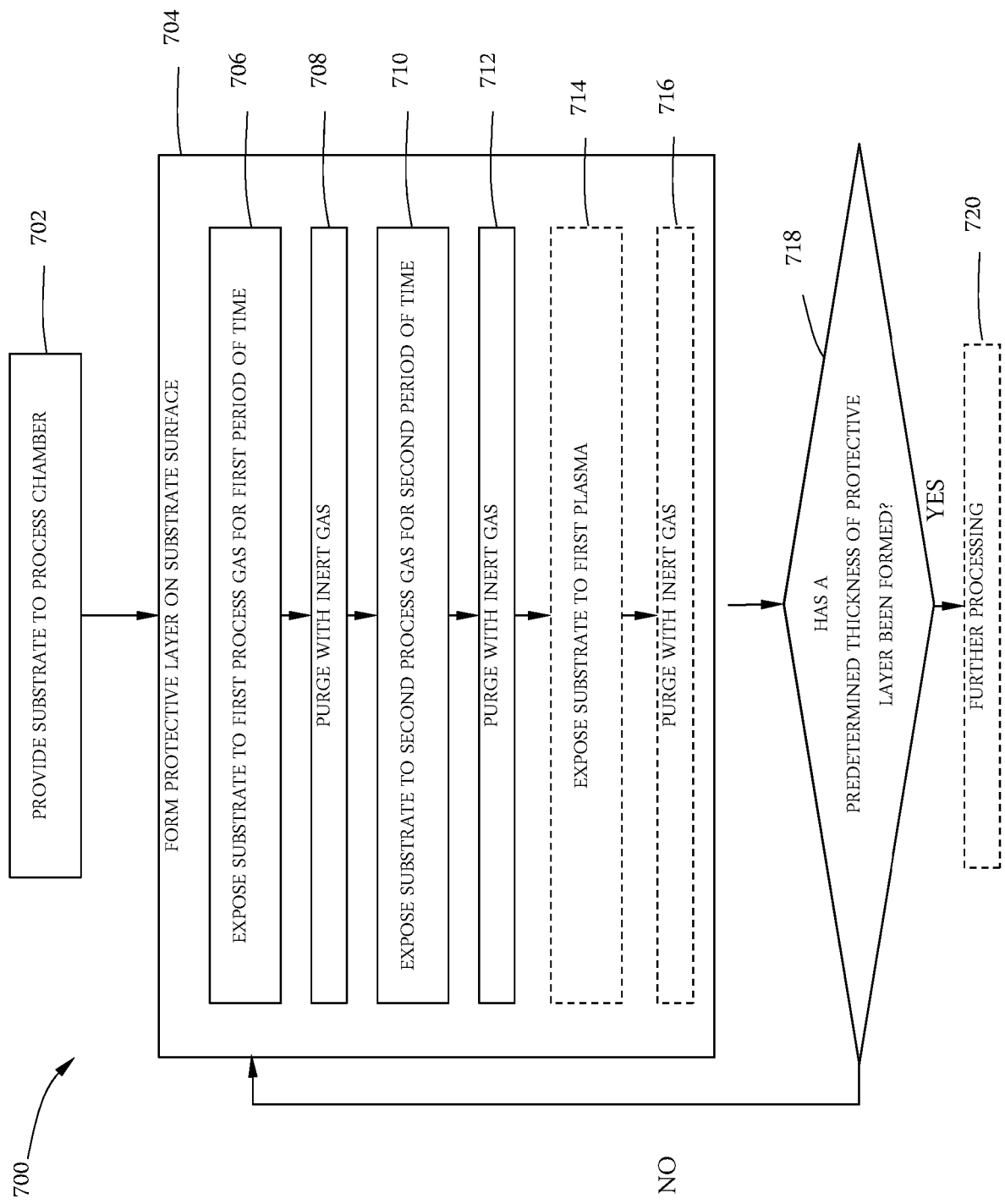
FIG. 7A illustrates an exemplary process sequence for the formation of a protective layer according to one or more embodiment of the disclosure.
Figure 7B:
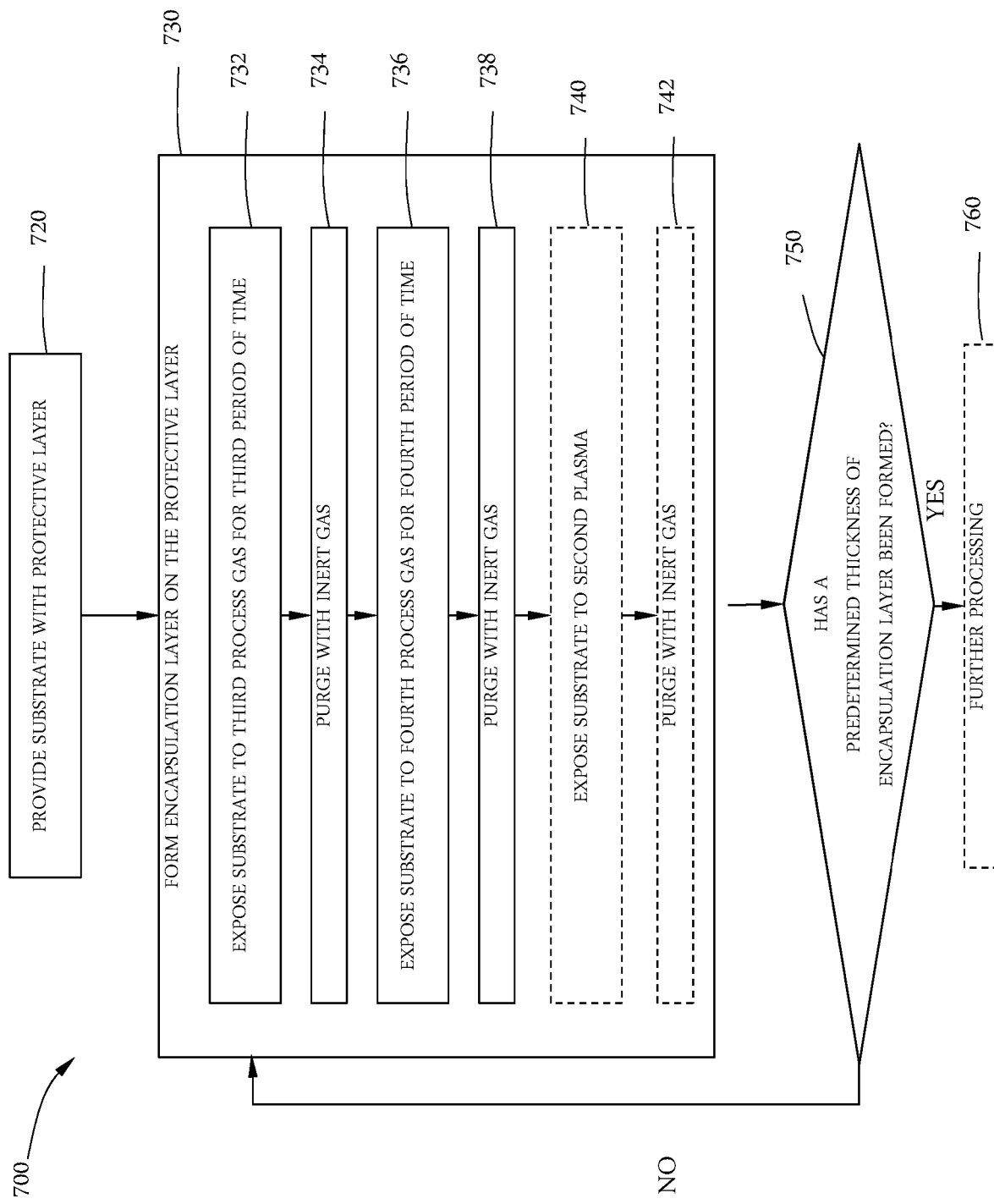
FIG. 7B illustrates an exemplary process sequence for the formation of an encapsulation layer according to one or more embodiment of the disclosure.

With reference to FIGS. 7A and 7B, one or more embodiment of the disclosure is directed to a method for forming an encapsulation stack on a substrate with at least one feature. The at least one feature of the substrate may be formed by various patterning and etching processes known in the art. FIG. 7A shows an exemplary process for forming a protective layer on the surface of the substrate feature. FIG. 7B shows an exemplary process for forming an encapsulation layer on the surface of the protective layer. The protective layer and the encapsulation layer and collectively referred to as the encapsulation stack.

Figure 8:
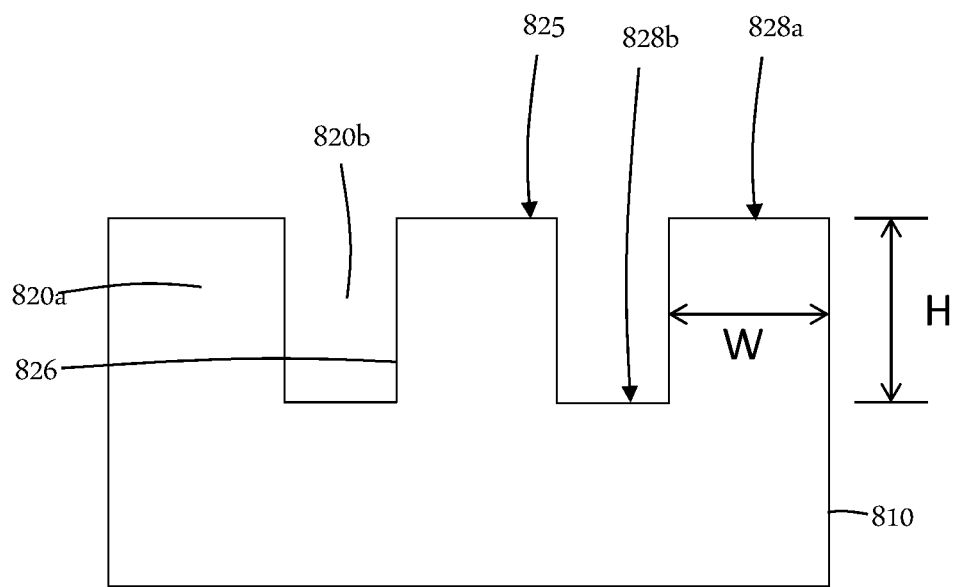
FIG. 8 illustrates a schematic representation of a substrate with multiple features in accordance with one or more embodiment of the disclosure.

FIG. 8 illustrates an exemplary substrate 810 with multiple features 820a, 820b formed thereon/therein. The substrate 810 shown in FIG. 8 comprises features 820a which extend from the substrate 810, also referred to as positive features, and features 820b which are recessed into the substrate 810, also referred to as negative features. As used in this disclosure, the term "feature" and reference numeral 820 is used as a general term for both positive features and negative features.

While the substrate and features shown in FIG. 8 are shown as being composed of the same material, no inference of the material composition should be interpreted from FIG. 8. The feature 820 has an exposed surface 825. The surface 825 of the features 820a, 820b comprises at least one sidewall 826 and a top 828a or bottom 828b.

Those skilled in the art will recognize that in practice, a substrate 810 may contain multiple positive features 820a positioned near each other, as shown in FIG. 8. Accordingly, the space (also referred to as a gap or trench) between two positive features 820a may create a negative feature 820b.

The feature 820 has a height H and a width W. The feature 820 of some embodiments is a rectangular prism shaped object with elongated sidewalls connected by shorter end walls (not shown). In some embodiments, the feature 820 is a cylindrical stack (positive) or via (negative) with one round sidewall and a top or bottom. In some embodiments, the feature 820 has an aspect ratio of greater than or equal to about 5, greater than or equal to about 7, or greater than or equal to about 10. As used in this regard, the aspect ratio of a feature is defined as the height H divided by the width W.

Figure 9A:
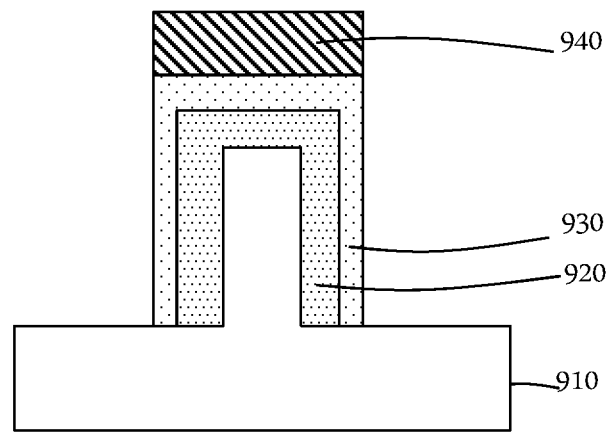
FIG. 9A illustrates a schematic representation of a substrate with a feature thereon comprised of multiple materials in accordance with one or more embodiment of the disclosure.
Figure 9B:
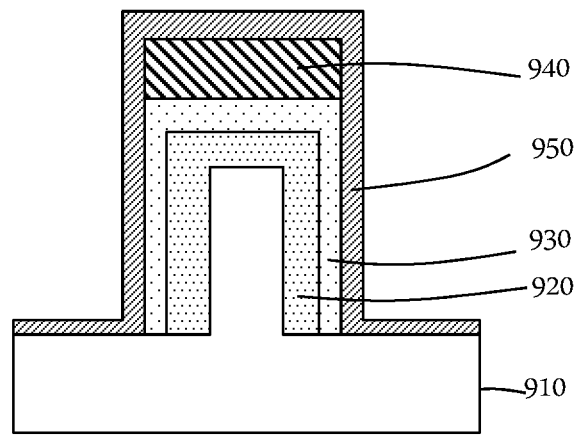
FIG. 9B illustrates a schematic representation of a substrate according to FIG. 9A covered by an encapsulation layer in accordance with one or more embodiment of the disclosure.

For simplicity and ease of understanding, FIGS. 9A and 9B show an exemplary substrate 910 with a single positive feature before and after processing according to one or more embodiment. As shown in FIG. 9A, in some embodiments, the feature comprises different materials 920, 930, 940. While three materials are shown in FIG. 9A, the feature may also comprise more materials or fewer materials. In some embodiments, the first material 920 may be the same or different from the material of the substrate 910 and the first material 920 forms a feature. In some embodiments, a second material 930 is deposited conformally over the first material 920. In some embodiments, the second material 930 is an oxide liner on the first material 920. In some embodiments, a third material 940 is deposited on the top surface of the second material 930, as shown in FIG. 9A. The arrangement of material layers shown in FIG. 9A is intended to be exemplary and is not intended to be limiting.

In some embodiments, the third material 940 is sensitive to air or moisture. In some embodiments, the third material is sensitive to oxygen. In some embodiments, the third material 940 is sensitive to water. As used in this regard, a material is "sensitive" to an environment or a species within an environment, if exposure to the environment or species alters the properties of the material. The property of the material that is altered may be altered as the result of a physical change (e.g. crystallinity, volatility) or a chemical change (e.g. oxidation state, contamination).

In some embodiments, the first material 920 comprises silicon, the second material 930 comprises silicon oxide and the third material 940 is a chalcogen material. As used in this regard, a "chalcogen material" is any material comprising a chalcogen. Exemplary chalcogens include, but are not limited to sulfur, selenium, tellurium and polonium. In some embodiments, the chalcogen material comprises a chalcogen and an element from Group 14 or Group 15 of the Periodic Table. In some embodiments, the third material 940 comprises one or more of AsS, GeS, GeSbTe, or GeSiAsTe.

As the third material 940 may be sensitive to air and moisture, some embodiments of this disclosure provide methods of forming an encapsulation stack 950 to cover and protect the exposed surface of the third material 940, as shown in FIG. 9B. While FIG. 9B shows a single layer, the encapsulation stack 950 comprises a plurality of layers deposited by different methods. In some embodiments, the encapsulation stack 950 covers and protects at least the third material 940. In some embodiments, the encapsulation stack 950 is continuous over the third material 940 and the second material 930. In some embodiments, the encapsulation stack is continuous over the surface of the feature regardless of the surface's composition.

In some embodiments, the encapsulation stack is hermetic. As used in this regard, a "hermetic" layer is resistant to oxidation by exposure to air or water. In some embodiments, the encapsulation stack comprises SiN, and resists the formation of SiON.

The encapsulation stack 950 may be exposed to oxidative test conditions to test the hermeticity of the encapsulation stack 950. Oxidative test conditions may include plasma enhanced atomic layer deposition of silicon oxide (60 Å using BDEAS and 50 W $O_2$/Ar plasma) on the stack surface, exposure to a low powered (e.g. 50 W) $O_2$/Ar plasma, or exposure to steam at an elevated temperature (e.g. 400° C.) for an extended period of time (e.g. 2 hours). Regardless of the test method, the depth of oxygen atoms within the film provides an indication of the hermeticity of the film, (i.e. shallower depths of oxidation indicate better or higher hermeticity). In some embodiments, the encapsulation stack 950 demonstrates less than or equal to about 5 Å of oxidation under oxidative test conditions, less than or equal to about 4 Å of oxidation under oxidative test conditions, less than or equal to about 3 Å of oxidation under oxidative test conditions, or less than or equal to about 2 Å of oxidation under oxidative test conditions.

Figure 10:
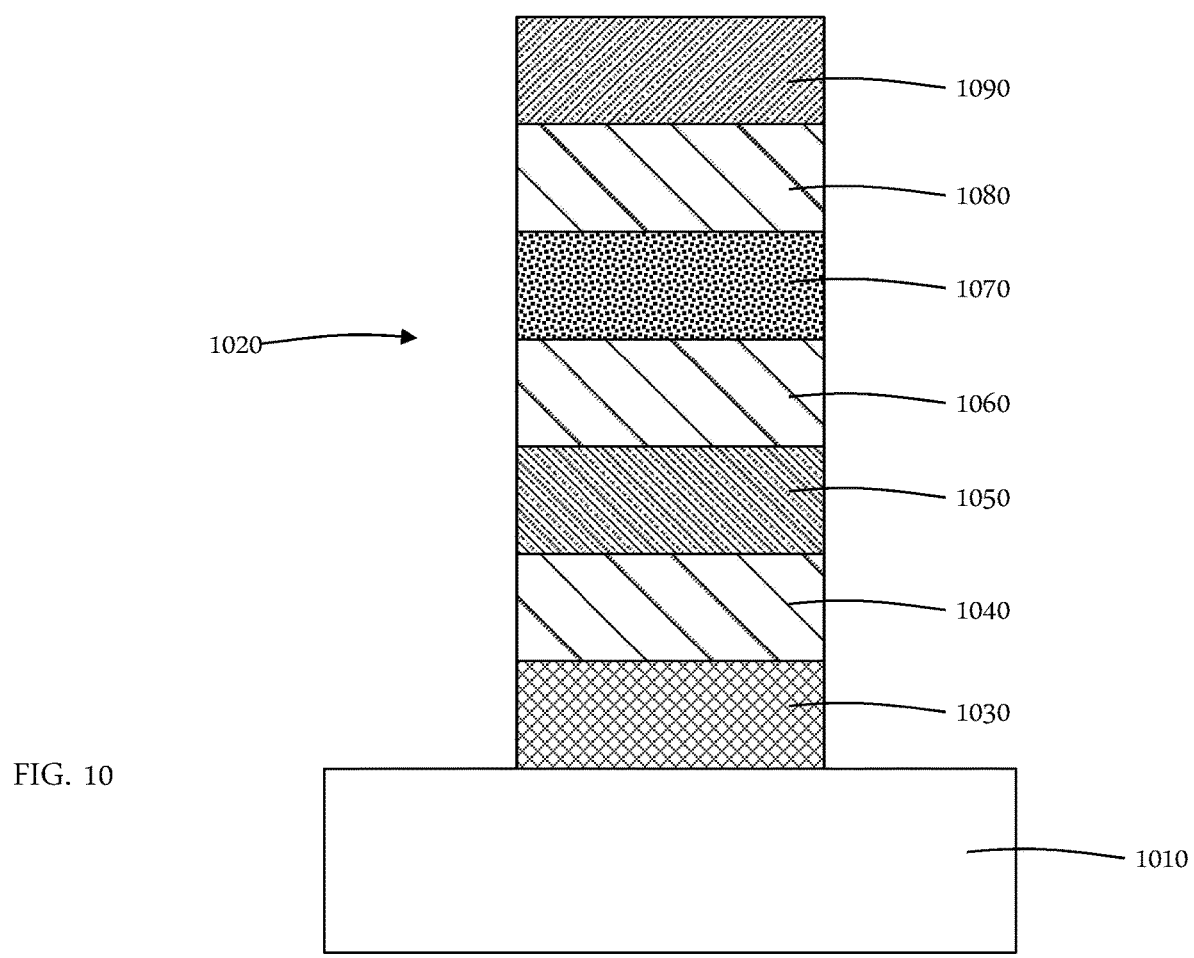
FIG. 10 illustrates an exemplary substrate with a PCRAM stack comprising multiple materials.

As shown in FIG. 10, in some embodiments, the feature comprises a stack 1020 of materials 1030-1090 on a substrate 1010. Accordingly, the surface of the stack 1020 comprises multiple material surfaces. Again, the composition, number and arrangement of materials in the feature shown in FIG. 10 is not intended to limit the scope of this disclosure.

In some embodiments, the stack 1020 comprises, from bottom to top, a conductor 1030, a bottom electrode 1040, an OTS material 1050, a middle electrode 1060, GST 1070, a top electrode 1080 and a hardmask 1090. In some embodiments, the conductor 1030 comprises or consists essentially of tungsten. In some embodiments, at least one of the top electrode 1040, the middle electrode 1060 and the top electrode 1080 comprises or consists essentially of carbon. In some embodiments, the OTS material 1050 comprises one or more of germanium, silicon, arsenic or tellurium. In some embodiments, the GST 1070 comprises germanium, antimony and tellurium. In some embodiments, the stack 1020 is a PCRAM stack.

Referring again to FIGS. 7A and 7B, the method 700 generally begins at 702 by providing a substrate 810. As used in this manner, "provided" means that the substrate 810 is placed into position or a suitable environment for processing. The substrate 810 has at least one feature 820 with a surface 825.

For simplicity and ease of understanding, reference is made in the following disclosure to the reference numerals used in describing the substrate shown in FIG. 8. This usage is not intended to be limiting as the method 700 can be performed using any suitable substrate.

At 704, a protective layer is formed on the surface 825. In some embodiments, the protective layer is conformal. In some embodiments, the protective layer comprises a dielectric material. The protective layer is formed by sequentially exposing the substrate to a first reactant and a second reactant. In some embodiments, the exposures are repeated in a cyclical deposition process, such as atomic layer deposition (ALD), or the like.

The process of forming the protective layer at 704 may begin by exposing the substrate to a first reactive gas comprising a first reactant. The first reactive gas is exposed to the substrate for a first period of time, as shown at 706. At 706, the first reactant adsorbs to the surface 825.

The first reactant may be any suitable reactant for forming the protective layer. In some embodiments, the first reactant comprises a silicon precursor. Suitable silicon precursors include but are not limited to $SiX_4$, where X is a halogen-like group; trisilyl amines (e.g. $N(SiH_3)_2$; or $SiR_aX_b$, where R is an organic group or H and a+b=4. Halogen-like groups include but are not limited to —Cl, —Br, —I, —CN, —CP, —OCN, —NCO, —SCN, —SeCN, and —$N_3$. Without being bound by theory, the Si—X bond of the silicon precursor is reactive, such that X can be replaced by nitrogen from the nitrogen precursor. In some embodiments, the first reactant does not contain any halogen atoms. In some embodiments, the first reactant comprises or consists essentially of $SiCl_4$, $SiBr_4$, $SiI_4$, $SiH_2Cl_2$ or $SiH_2I_2$.

In some embodiments, the first reactant comprises a metal precursor. In some embodiments, the first reactant comprises an aluminum precursor. Suitable aluminum precursors include but are not limited to aluminum complexes comprising aluminum and alkyl groups, alkylamino groups and/or alkoxy groups. Examples of suitable aluminum precursors include $Al(Me)_3$, $Al(Et)_3$, $Al(iBu)_3$, $Al(tBu)_3$, $Al(N(Me)_2)_3$, etc.

Next, at 708, the process chamber (especially in time-domain ALD) may be purged using an inert gas. The inert gas may be any inert gas, for example, such as argon, helium, neon or the like. In some embodiments, the inert gas may be the same, or alternatively, may be different from the inert gas provided to the process chamber during the exposure of the substrate to the first reactant at 706. In embodiments where the inert gas is the same, the purge may be performed by diverting the first reactive gas from the process chamber, allowing the inert gas to flow through the process chamber, purging the process chamber of any excess first process gas components or reaction byproducts. In some embodiments, the inert gas may be provided at the same flow rate used in conjunction with the first reactive gas, described above, or in some embodiments, the flow rate may be increased or decreased. For example, in some embodiments, the inert gas may be provided to the process chamber at a flow rate of about 0 to about 10,000 sccm to purge the process chamber.

In spatial ALD, purge gas curtains may be maintained between the flows of reactive gases and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess silicon halide precursor from the process chamber, preventing a gas phase reaction between the silicon halide precursor and a subsequent reactive gas.

The process of forming the protective layer at 704 continues by exposing the substrate to a second reactive gas comprising a second reactant. The second reactive gas is exposed to the substrate for a second period of time, as shown at 710. The second reactant reacts with the first reactant adsorbed on the substrate surface to form a protective layer.

In some embodiments, the second reactant comprises a nitrogen precursor. In some embodiments, the nitrogen precursor comprises or consists essentially of one or more of nitrogen gas ($N_2$), ammonia ($NH_3$), hydrazine ($N_2H_4$) or derivatives thereof (e.g. alkylamines, alkyl hydrazines)

In some embodiments, the protective layer comprises silicon nitride. In some embodiments, the protective layer comprises amorphous silicon. In some embodiments, the protective layer comprises aluminum nitride.

In some embodiments, the second reactant comprises an oxygen precursor. In some embodiments, the protective layer comprises a metal oxide. In some embodiments, the protective layer comprises aluminum oxide. In some embodiments, the oxygen precursor comprises or consists essentially of an alcohol. Exemplary alcohols include, but are not limited to, ethanol, isopropanol, and t-butanol. In some embodiments, the oxygen precursor contains substantially no water. Without being bound by theory, the potentially sensitive materials of the feature surface would be damaged by exposure to water. Accordingly, the aluminum oxide layer of some embodiments is formed by a "dry" process which utilizes small alcohols rather than water.

In some embodiments, the process of forming the protective layer comprises substantially no plasma. Stated differently, in some embodiments, the protective layer is formed by a thermal ALD process.

In some embodiments, the process of forming the protective layer comprises exposing the substrate to a first plasma. In some embodiments, the first plasma is a plasma of the second reactant. In these embodiments, at 710, the substrate is exposed to the second process gas comprising the first plasma. In some embodiments, the second process gas comprises a plasma generated from ammonia gas.

In some embodiments, the process of forming the protective layer at 704 includes a separate plasma exposure at 714. In some embodiments, the plasma exposure at 714 is separated from other processes by purging with inert gas at 712 and 716. For example, in some embodiments, the second process gas comprises ammonia and the first plasma comprises a plasma generated from an argon/nitrogen gas mixture.

In some embodiments, the first plasma is generated from a first plasma gas comprising one or more of nitrogen gas, argon gas, helium, ammonia or one of the nitrogen-containing second reactants identified above. In some embodiments, the first plasma is generated from a mixture of argon and nitrogen gasses. The ratio of argon and nitrogen gasses can be adjusted to affect the deposition rate of the protective later as well as properties of the formed protective layer. In some embodiments, the ratio of argon:nitrogen is in a range of about 1:100 to about 100:1. In some embodiments, the ratio of argon:nitrogen is greater than or equal to about 1:1, greater than or equal to about 2:1, greater than or equal to about 4:1, or greater than or equal to about 9:1.

The first plasma may be generated remotely or within the processing chamber. The first plasma may be a microwave plasma, an inductively coupled plasma (ICP) or a conductively coupled plasma (CCP). Any suitable power can be used depending on, for example, the reactants, or the other process conditions. In some embodiments, the first plasma is generated with a plasma power in the range of about 10 W to about 200 W. In some embodiments, the first plasma is a microwave plasma generated with a plasma power in the range of about 10 W to about 1700 W. In some embodiments, the first plasma is generated with a plasma power less than or equal to about 200 W, less than or equal to about 150 W, less than or equal to about 100 W, less than or equal to about 50 W, or less than or equal to about 35 W.

In some embodiments, the temperature of the substrate is maintained while the protective layer is formed at 704. In some embodiments, the substrate is maintained at a temperature in the range of about 200° C. to about 400° C., about 200° C. to about 300° C., about 200° C. to about 280° C., or about 200° C. to about 250° C. In some embodiments, the substrate is maintained at a temperature less than or equal to about 400° C., less than or equal to about 300° C., less than or equal to about 280° C., or less than or equal to about 250° C. In some embodiments, the substrate is maintained at a temperature of about 250° C.

Next, at 712, the process chamber may be purged using an inert gas. The inert gas may be any inert gas, for example, such as argon, helium, neon or the like. In some embodiments, the inert gas may be the same, or alternatively, may be different from the inert gas provided to the process chamber during previous process routines. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

The various process parameters for depositing the protective layer may be varied. In some embodiments, the substrate is exposed to the first reactant for a first period of time and the substrate is exposed to the second reactant for a second, different, period of time.

The pressure at which the substrate surface is exposed to each of the process gases and/or the plasma can be varied depending on, for example, the reactants selected and other process conditions (e.g. temperature). In some embodiments, exposure to each of the precursors occurs at a pressure in the range of about 5 Torr to about 100 Torr. In one or more embodiments, exposure to each of the precursors occurs at a pressure in the range of about 5 Torr to about 100 Torr, or in the range of about 10 Torr to about 80 Torr, or in the range of about 15 Torr to about 50 Torr. In some embodiments, exposure to each of the precursors occurs at a pressure greater than or equal to about 5 Torr greater than or equal to about 10 Torr, greater than or equal to about 15 Torr, or greater than or equal to about 20 Torr.

As stated previously. in some embodiments, the protective layer is substantially conformal to the substrate surface. As used in this regard, the term "conformal" means that the thickness of the layer is uniform across the substrate surface. As used in this specification and the appended claims, the term "substantially conformal" means that the thickness of the layer does not vary by more than about 40%, 30%, 20%, 10%, 5%, 2%, 1%, or 0.5% relative to the average thickness of the layer. Stated differently a layer which is substantially conformal has a conformality of greater than about 60%, 70%, 80%, 90%, 95%, 98%, 99% or 99.5%.

Next, at 718, it is determined whether the protective layer has been formed to a predetermined thickness. If the predetermined thickness has not been achieved, the method 700 returns to 704 to continue forming the protective layer until the predetermined thickness is reached. Once the predetermined thickness has been reached, the method 700 proceeds to 720 for further processing. In some embodiments, the protective layer may be deposited with a thickness in a range of about 5 to about 50 Å, about 10 to about 50 Å, or in some embodiments, about 20 to about 30 Å. In some embodiments, the protective layer has a thickness of about 5 Å, about 10 Å, about 15 Å, about 20 Å, about 25 Å, about 30 Å or about 35 Å.

Without being bound by theory, the inventors have found that damage to the underlying substrate may be minimized by maximizing the growth rate of the protective layer. The growth rate of the protective layer may be evaluated in terms of growth per cycle (GPC), where each ALD cycle deposits an average thickness. The growth rate of the protective layer may also be evaluated in terms of growth per minute (GPM), where total growth is divided by total processing time.

In some embodiments, the growth rate is greater than or equal to about 0.20 Å/cycle, greater than or equal to about 0.25 Å/cycle, greater than or equal to about 0.3 Å/cycle, greater than or equal to about 0.4 Å/cycle, or greater than or equal to about 0.5 Å/cycle, or greater than or equal to about 1.0 Å/cycle, greater than or equal to about 1.5 Å/cycle.

In some embodiments, a spatial ALD apparatus as described above is utilized. In some embodiments, each full rotation corresponds to two ALD cycles. Accordingly, growth rates can also be expressed in GPM when the revolutions per minutes (RPM) is also known.

In some embodiments, the RPM is in a range of about 1 RPM to about 50 RPM, about 1 RPM to about 20 RPM, about 1 RPM to about 10 RPM, or about 1 RPM to about 5 RPM. In some embodiments, the RPM is about 2 RPM, about 3 RPM, about 5 RPM, about 10 RPM or about 20 RPM.

In some embodiments, the growth rate is greater than or equal to about 1 Å/min, greater than or equal to about 2 Å/min, greater than or equal to about 5 Å/min, greater than or equal to about 10 Å/min, greater than or equal to about 12 Å/min, greater than or equal to about 15 Å/min, greater than or equal to about 18 Å/min, or greater than or equal to about 20 Å/min. In some embodiments, the growth rate is about 20 Å/min.

As discussed elsewhere herein, the disclosed processes also provide minimal damage to the underlying substrate materials. In some embodiments, the process of forming the protective layer does not damage the substrate surface. In some embodiments, the process of forming the encapsulation stack does not damage the substrate surface. Stated differently, the disclosed processes leave the stack substantially undamaged.

One method of evaluating the damage caused by a PEALD process comprising a nitrogen plasma is by measuring the depth of nitridation of the underlying substrate materials. In some embodiments, when deposited on a silicon substrate, the depth of nitridation is less than or equal to about 12 Å, less than or equal to about 10 Å, or less than or equal to about 8 Å.

As discussed elsewhere herein, the disclosed processes also provide good adhesion to the underlying substrate materials. In some embodiments, the protective layer substantially adheres to the surface of the substrate and/or feature. In some embodiments, the encapsulation layer (described below) substantially adheres to the protective layer. As used in this description, a layer which "substantially adheres" to an underlying layer passes a tape test (described above) with a pass rate of greater than or equal to about 95%, 98% or 99%. In some embodiments, a layer which substantially adheres to an underlying layer has a pass rate of about 100%.

Without being bound by theory, the inventors have found that when carbon is present as an underlying layer, adhesion is particularly difficult. Accordingly, in some embodiments, the surface of the feature comprises a carbon material surface and the protective layer substantially adheres to the carbon material surface.

Referring to FIG. 7B, the method 700 continues at 720 by further processing the substrate containing the protective layer. At 720, a substrate with a protective layer is provided. The substrate has been processed according to the method 700 described above with reference to FIG. 7A.

At 730, an encapsulation layer is formed on the surface of the substrate. In some embodiments, the encapsulation layer is conformal. In some embodiments, the encapsulation layer comprises a dielectric material. The encapsulation layer is formed by sequentially exposing the substrate to a third reactant and a fourth reactant. In some embodiments, the exposures are repeated in a cyclical deposition process, such as atomic layer deposition (ALD), or the like.

The process of forming the encapsulation layer at 730 may begin by exposing the substrate to a third reactive gas comprising a third reactant. The third reactive gas is exposed to the substrate for a third period of time, as shown at 732. At 732, the third reactant adsorbs to the surface of the protective layer.

The third reactant may be any suitable reactant for forming the encapsulation layer. In some embodiments, the third reactant is the same as the first reactant. In some embodiments, the third reactant is different from the first reactant.

In some embodiments, the third reactant comprises a silicon precursor. Suitable silicon precursors include but are not limited to $SiX_4$, where X is a halogen-like group; trisilyl amines (e.g. $N(SiH_3)_2$; or $SiR_aX_b$, where R is an organic group and a+b=4. Halogen-like groups include but are not limited to —Cl, —Br, —I, —CN, —CP, —OCN, —NCO, —SCN, —SeCN, and —$N_3$. Without being bound by theory, the Si—X bond of the silicon precursor is reactive, such that X can be replaced by nitrogen from the nitrogen precursor. In some embodiments, the third reactant does not contain any halogen atoms.

Next, at 734, the process chamber (especially in time-domain ALD) may be purged using an inert gas. The inert gas may be any inert gas, for example, such as argon, helium, neon or the like. The purge process at 734 is similar to the purge processes described elsewhere herein. In spatial ALD, purge gas curtains may be maintained between the flows of reactive gases and purging the process chamber may not be necessary. In some embodiments of a spatial ALD process, at 734, the process chamber or region of the process chamber may be purged with an inert gas.

The process of forming the encapsulation layer at 730 continues by exposing the substrate to a fourth reactive gas comprising a fourth reactant. The fourth reactive gas is exposed to the substrate for a fourth period of time, as shown at 736. The fourth reactant reacts with the third reactant adsorbed on the surface of the protective layer to form an encapsulation layer.

In some embodiments, the fourth reactant comprises a nitrogen precursor. In some embodiments, the nitrogen precursor comprises or consists essentially of one or more of nitrogen gas ($N_2$), ammonia ($NH_3$), hydrazine ($N_2H_4$) or derivatives thereof (e.g. alkylamines, alkyl hydrazines, etc.)

In some embodiments, the encapsulation layer comprises silicon nitride. In some embodiments, the encapsulation layer comprises aluminum nitride.

The process of forming the protective layer comprises exposing the substrate to a second plasma. In some embodiments, the second plasma is a plasma of the fourth reactant. In these embodiments, at 736, the substrate is exposed to the fourth process gas comprising the second plasma. In some embodiments, the fourth process gas comprises a plasma generated from ammonia gas.

In some embodiments, the process of forming the encapsulation layer at 730 includes a separate plasma exposure at 740. In some embodiments, the plasma exposure at 740 is separated from other processes by purging with inert gas at 738 and 742. For example, in some embodiments, the fourth process gas comprises ammonia and the second plasma comprises a plasma generated from an argon/nitrogen gas mixture.

In some embodiments, the second plasma is generated from a second plasma gas comprising one or more of nitrogen gas, argon, helium, ammonia or one of the nitrogen-containing fourth reactants identified above. In some embodiments, the second plasma is generated from a mixture of argon and nitrogen gasses. The ratio of argon and nitrogen gasses can be adjusted to affect the deposition rate of the protective later as well as properties of the formed protective layer. In some embodiments, the ratio of argon:nitrogen is in a range of about 1:100 to about 100:1. In some embodiments, the ratio of argon:nitrogen is greater than or equal to about 1:1, greater than or equal to about 2:1, greater than or equal to about 4:1, or greater than or equal to about 9:1.

The second plasma may be generated remotely or within the processing chamber. The second plasma may be a microwave plasma, an inductively coupled plasma (ICP) or a conductively coupled plasma (CCP). Any suitable power can be used depending on, for example, the reactants, or the other process conditions. In some embodiments, the second plasma is generated with a plasma power in the range of about 10 W to about 200 W. In some embodiments, the second plasma is a microwave plasma generated with a plasma power in the range of about 10 W to about 1700 W. In some embodiments, the second plasma is generated with a plasma power greater than or equal to about 10 W, greater than or equal to about 35 W, greater than or equal to about 50 W, greater than or equal to about 100 W, or greater than or equal to about 150 W.

In some embodiments, the temperature of the substrate is maintained while the encapsulation layer is formed at 730. In some embodiments, the substrate is maintained at a temperature in the range of about 200° C. to about 400° C., about 200° C. to about 300° C., about 200° C. to about 280° C., or about 200° C. to about 250° C. In some embodiments, the substrate is maintained at a temperature less than or equal to about 400° C., less than or equal to about 300° C., less than or equal to about 280° C., or less than or equal to about 250° C. In some embodiments, the substrate is maintained at a temperature of about 250° C.

Next, at 738, the process chamber may be purged using an inert gas. The inert gas may be any inert gas, for example, such as argon, helium, neon or the like. In some embodiments, the inert gas may be the same, or alternatively, may be different from the inert gas provided to the process chamber during previous process routines. The purge process at 738 is similar to the purge processes described elsewhere herein.

The various process parameters for depositing the protective layer may be varied. In some embodiments, the substrate is exposed to the first reactant for a first period of time and the substrate is exposed to the second reactant for a second, different, period of time. In some embodiments, the silicon precursor is exposed to the substrate for a period of time about twice as long as the period of time that the substrate is exposed to the nitrogen precursor. In some time-domain ALD embodiments, the first or second period of time may be in the range of about 1 sec to about 120 sec, or in the range of about 2 sec to about 60 sec, or in the range of about 5 sec to about 30 sec.

The pressure at which the substrate surface is exposed to each of the process gases and/or the plasma can be varied depending on, for example, the reactants selected and other process conditions (e.g. temperature). In some embodiments, exposure to each of the precursors occurs at a pressure in the range of about 0.1 Torr to about 100 Torr. In one or more embodiments, the substrate is exposed at a pressure in the range of about 0.1 Torr to about 100 Torr, or in the range of about 1 Torr to about 50 Torr, or in the range of about 2 Torr to about 30 Torr. In some embodiments, the substrate is exposed to the process gases at a pressure of about 5 Torr, about 10 Torr, about 15 Torr, or about 20 Torr.

The various process parameters for depositing the encapsulation layer may be varied. In some embodiments, the substrate is exposed to the third reactant for a third period of time and the substrate is exposed to the fourth reactant for a fourth, different, period of time.

The pressure at which the substrate surface is exposed to each of the process gases and/or the plasma can be varied depending on, for example, the reactants selected and other process conditions (e.g. temperature). In some embodiments, exposure to each of the precursors occurs at a pressure in the range of about 5 Torr to about 100 Torr. In one or more embodiments, exposure to each of the precursors occurs at a pressure in the range of about 5 Torr to about 100 Torr, or in the range of about 10 Torr to about 80 Torr, or in the range of about 15 Torr to about 50 Torr. In some embodiments, exposure to each of the precursors occurs at a pressure greater than or equal to about 10 Torr. In some embodiments, exposure to each of the precursors occurs at a pressure less than or equal to about 25 Torr, less than or equal to about 20 Torr, less than or equal to about 15 Torr, less than or equal to about 10 Torr, or less than or equal to about 5 Torr.

As stated previously. in some embodiments, the encapsulation layer is substantially conformal to the substrate surface. As used in this regard, the term "conformal" means that the thickness of the layer is uniform across the substrate surface. As used in this specification and the appended claims, the term "substantially conformal" means that the thickness of the layer does not vary by more than about 40%, 30%, 20%, 10%, 5%, 2%, 1%, or 0.5% relative to the average thickness of the layer. Stated differently a layer which is substantially conformal has a conformality of greater than about 60%, 70%, 80%, 90%, 95%, 98%, 99% or 99.5%.

Next, at 750, it is determined whether the encapsulation layer has been formed to a predetermined thickness. If the predetermined thickness has not been achieved, the method 700 returns to 730 to continue forming the encapsulation layer until the predetermined thickness is reached. Once the predetermined thickness has been reached, the method 700 can end or can proceed to 760 for further processing. In some embodiments, the encapsulation layer may be deposited to a thickness of about 8 Å to about 50 Å, or in some embodiments, about 10 Å to about 20 Å. In some embodiments, the encapsulation layer has a thickness of about 8 Å, about 9 Å, about 10 Å, about 15 Å, about 20 Å, or about 25 Å. In some embodiments, the encapsulation layer has a thickness of less than or equal to about 50 Å, less than or equal to about 20 Å, less than or equal to about 10 Å, or less than or equal to about 5 Å. In some embodiments, the encapsulation layer has a thickness of greater than or equal to about 5 Å, greater than or equal to about 10 Å, greater than or equal to about 20 Å, or greater than or equal to about 50 Å, In some embodiments, the encapsulation layer is substantially conformal to the substrate surface. As used in this specification and the appended claims, the term "substantially conformal" means that the thickness of the layer does not vary by more than about 40%, 30%, 20%, 10%, 5%, 2%, 1%, or 0.5% relative to the average thickness of the layer. Stated differently a layer which is substantially conformal has a conformality of greater than about 60%, 70%, 80%, 90%, 95%, 98%, 99% or 99.5%.

The encapsulation layer has high wet etch resistance (i.e., a low etch rate). In some embodiments, the wet etch rate of the encapsulation layer in 1000:1 DHF is less than or equal to about 10 Å/min, less than or equal to about 8.5 Å/min, less than or equal to about 8 Å/min, less than or equal to about 7.5 Å/min, less than or equal to about 7 Å/min, or less than or equal to about 6.5 Å/min.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an encapsulation stack, the method comprising:
    providing a substrate with a surface having at least one feature thereon, the surface comprising a film stack with a first exposed material and a second exposed material, the first exposed material comprising carbon and the second exposed material comprising a chalcogen, the feature having a height and width defining an aspect ratio;
    forming a conformal dielectric protective layer directly on the first exposed material and the second exposed material by sequentially exposing the substrate to a first reactant and a second reactant, the protective layer comprising silicon nitride, and the first reactant comprising $SiR_aX_b$, where R is an organic group or H, X is a halogen, and a+b=4; and
    forming a conformal hermetic encapsulation layer on the protective layer by sequentially exposing the substrate to a silicon precursor and a nitrogen precursor and a second plasma, the encapsulation layer comprising silicon nitride, wherein the substrate is maintained at a temperature less than or equal to about 250° C.,
    wherein the protective layer is formed at a rate of greater than or equal to about 1 Å/min and the protective layer is formed without damaging the second exposed material.

2. The method of claim 1, wherein the protective layer substantially adheres to the surface of the first exposed material and the second exposed material.

3. The method of claim 1, wherein the aspect ratio is greater than or equal to 5:1.

4. The method of claim 1, wherein forming the protective layer comprises exposing the substrate to a first plasma with a power less than or equal to about 200 W.

5. The method of claim 4, wherein the surface of the substrate is nitridated to a depth of less than or equal to about 10 Å.

6. The method of claim 1, wherein the substrate is maintained at a pressure greater than or equal to about 5 Torr during formation of the protective layer.

7. The method of claim 1, wherein the second plasma has a power greater than or equal to about 50 W.

8. The method of claim 1, wherein the substrate is maintained at a pressure less than or equal to about 20 Torr during formation of the encapsulation layer.

9. The method of claim 1, wherein the encapsulation layer is formed by a plurality of exposure cycles, the cycles repeated at a rate of less than or equal to about 20 cycles/minute.

10. The method of claim 1, wherein the encapsulation layer has a wet etch rate of less than or equal to about 8.5 Å/min in 100:1 DHF.

11. The method of claim 1, wherein the encapsulation layer has a thickness of greater than or equal to about 10 Å.

12. The method of claim 1, wherein oxidation of the encapsulation layer is less than or equal to about 3 Å under oxidative test conditions comprising one or more of PEALD of 60 Å of silicon oxide using BDEAS and 50 W of $O_2$/Ar plasma or a steam anneal at 400° C. for 2 hours.

13. The method of claim 3, wherein the aspect ratio is greater than or equal to about 10:1.

14. The method of claim 1, wherein the first reactant consists essentially of one or more of $SiCl_4$, $SiBr_4$, $SiI_4$, $SiH_2Cl_2$ or $SiH_2I_2$.

15. The method of claim 14, wherein the first reactant comprises chlorine.

16. The method of claim 14, wherein the first reactant comprises bromine.

17. The method of claim 1, wherein the first reactant comprises iodide.

18. The method of claim 1, wherein forming the protective layer comprises substantially no plasma.

* * * * *